(12) United States Patent
Lin et al.

(10) Patent No.: US 10,886,394 B1
(45) Date of Patent: Jan. 5, 2021

(54) SEMICONDUCTOR STRUCTURE

(71) Applicant: Vanguard International Semiconductor Corporation, Hsinchu (TW)

(72) Inventors: Shin-Cheng Lin, Tainan (TW);
Wen-Hsin Lin, Jhubei (TW);
Marojahan Tampubolon, Tapanuli Utara (ID)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/446,198

(22) Filed: Jun. 19, 2019

(51) Int. Cl.
*H01L 29/778* (2006.01)
*H01L 29/417* (2006.01)
*H01L 29/06* (2006.01)
*H01L 23/48* (2006.01)
*H01L 29/205* (2006.01)
*H01L 29/20* (2006.01)

(52) U.S. Cl.
CPC ........ *H01L 29/7787* (2013.01); *H01L 23/481* (2013.01); *H01L 29/0653* (2013.01); *H01L 29/4175* (2013.01); *H01L 29/2003* (2013.01); *H01L 29/205* (2013.01)

(58) Field of Classification Search
CPC ............. H01L 51/56; H01L 2251/5338; H01L 51/0097; H01L 27/3246; H01L 51/0072
USPC .......................................................... 257/77
See application file for complete search history.

(56) References Cited

U.S. PATENT DOCUMENTS

| 6,845,034 B2 | 1/2005 | Bhattacharyya |
| 2013/0260505 A1* | 10/2013 | Bedell ................. H01L 27/1203 438/67 |
| 2016/0086980 A1 | 3/2016 | Cao et al. |
| 2017/0358497 A1* | 12/2017 | Cheng ............. H01L 21/823481 |
| 2018/0182854 A1* | 6/2018 | Ozaki ............... H01L 23/49513 |

OTHER PUBLICATIONS

Taiwanese Office Action and Search Report, dated Dec. 11, 2019, for Taiwanese Application No. 108113124.

* cited by examiner

*Primary Examiner* — Andy Huynh
(74) *Attorney, Agent, or Firm* — Birch, Stewart, Kolasch & Birch, LLP

(57) ABSTRACT

A semiconductor structure includes a substrate having an active region and an isolation region, an insulating layer disposed on the substrate, a seed layer disposed on the insulating layer, a compound semiconductor layer disposed on the seed layer, a gate structure in the active region disposed on the compound semiconductor layer, an isolation structure in the isolation region disposed on the substrate, a pair of through-substrate vias in the isolation region disposed on the opposite sides of the gate structure, and a source structure and a drain structure disposed on the substrate and on the opposite sides of the gate structure. The pair of through-substrate vias pass through the isolation structure and contact the seed layer. The source structure and the drain structure electrically connect the seed layer by the pair of through-substrate vias.

20 Claims, 5 Drawing Sheets

SEMICONDUCTOR STRUCTURE

BACKGROUND

Technical Field

The disclosure relates to a semiconductor structure, and more particularly to a semiconductor structure having a pair of through-substrate vias that are in contact with a seed layer.

Description of the Related Art

Gallium nitride-based (GaN-based) semiconductor materials have many excellent characteristics, such as high thermal resistance, wide band-gap, and a high electron saturation rate. Therefore, GaN-based semiconductor materials are suitable for use in high-speed and high-temperature operating environments. In recent years, GaN-based semiconductor materials have been widely used in light-emitting diode (LED) elements and high-frequency elements, such as high electron mobility transistors (HEMT) with heterogeneous interfacial structures.

When a high electron mobility transistor (HEMT) device is in operation, due to the material characteristics of epitaxial layers, a large number of impurities with negative charges can exist in an epitaxial layer which is located at the bottom of the device structure. At this time, if a high voltage is applied, these negative charges will be attracted to, and therefore move toward, the upper components of the device, adversely affecting the operation of the upper components. To solve this problem using present technologies, the silicon substrate under the epitaxial layer is usually grounded to discharge the negative charges of the impurities. However, this method is not feasible for use with all types of substrates.

With the developments of GaN-based semiconductor materials, those semiconductor devices which use GaN-based semiconductor materials are applied in the more demanding working environments, such as those with higher frequencies or higher temperatures. Therefore, the conditions of the process of fabricating semiconductor devices with GaN-based semiconductor materials face various new challenges.

SUMMARY

In one embodiment of the present disclosure, a semiconductor structure is provided, wherein the semiconductor structure includes a substrate, an insulating layer, a seed layer, a compound semiconductor layer, a gate structure, an isolation structure, a pair of through-substrate vias, a source structure, and a drain structure. The substrate has an active region and an isolation region. The insulating layer is disposed on the substrate. The seed layer is disposed on the insulating layer. The compound semiconductor layer is disposed on the seed layer. The gate structure is in the active region and disposed on the compound semiconductor layer. The isolation structure is in the isolation region and disposed on the substrate. The pair of through-substrate vias are in the isolation region and disposed on opposite sides of the gate structure, wherein the pair of through-substrate vias pass through the isolation structure and contact the seed layer. The source structure and the drain structure are disposed on the substrate and on opposite sides of the gate structure, wherein the source structure and the drain structure are respectively electrically connected to the seed layer by the pair of through-substrate vias.

In one embodiment of the present disclosure, a semiconductor structure is provided, wherein the semiconductor structure includes a ceramic substrate, an insulating layer, a seed layer, a compound semiconductor layer, a gate structure, a source structure, and a drain structure. The ceramic substrate has an active region and an isolation region. The insulating layer is disposed on the ceramic substrate. The seed layer is disposed on the insulating layer. The compound semiconductor layer is disposed on the seed layer. The gate structure is in the active region and disposed on the compound semiconductor layer. The source structure and a drain structure are disposed on the ceramic substrate and on opposite sides of the gate structure, wherein the source structure and the drain structure are respectively electrically connected to the seed layer.

BRIEF DESCRIPTION OF THE DRAWINGS

Aspects of this disclosure are best understood from the following detailed description when read with the accompanying figures. It should be noted that, in accordance with common practice in the industry, various features are not drawn to scale. In fact, the dimensions of the various features may be arbitrarily increased or reduced for clarity of discussion.

DETAILED DESCRIPTION

Figure 1A:
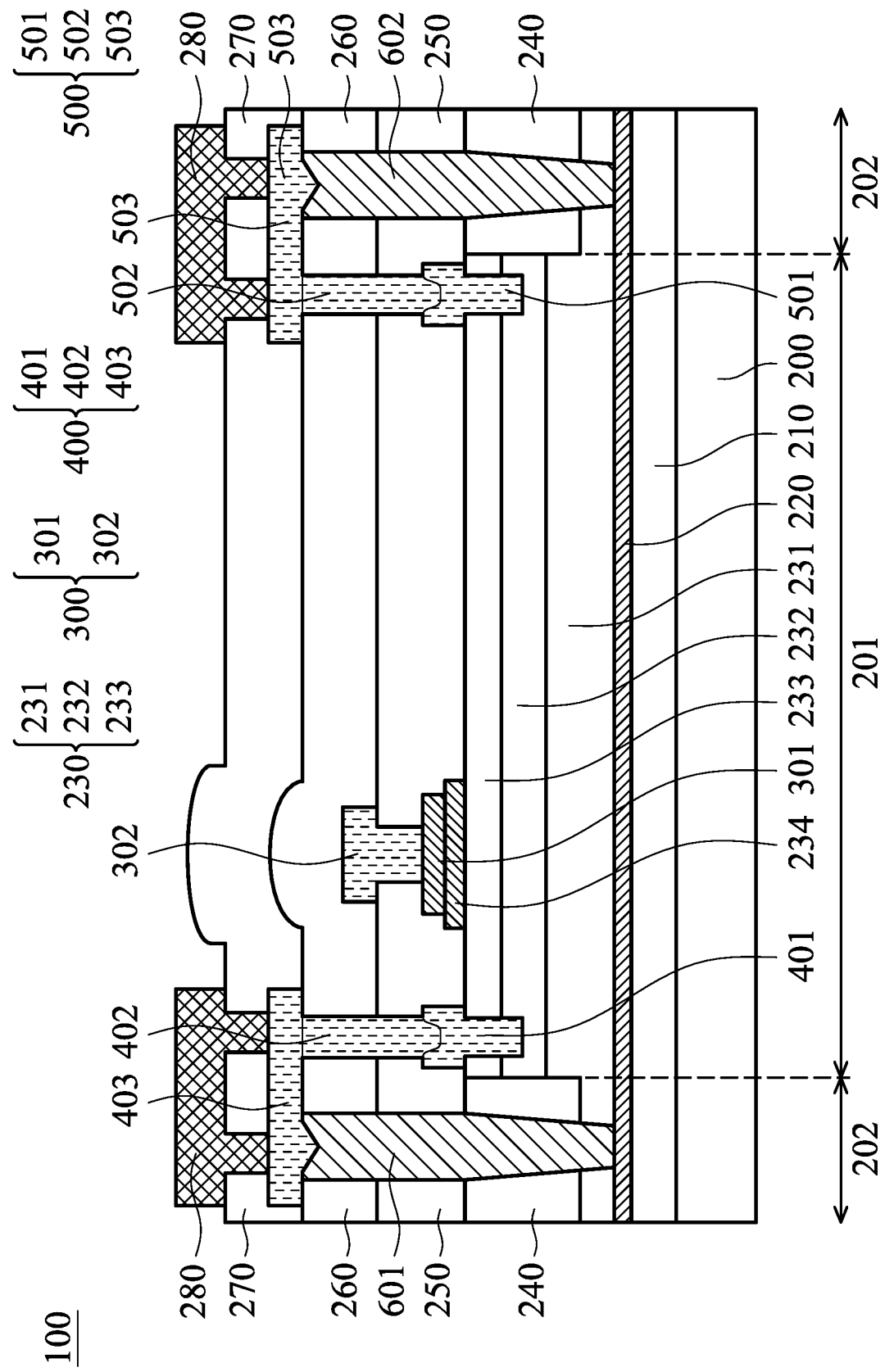
FIG. 1A is a cross-sectional view illustrating an exemplary semiconductor structure according to some embodiments of the present disclosure.

The following disclosure provides many different embodiments, or examples, for implementing different features of the subject matter provided. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "over", "below," "lower," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented and the spatially relative descriptors used herein may likewise be interpreted accordingly.

The terms "about", "approximately", and "substantially" used herein generally refer to the value of an error or a range within 20 percent, preferably within 10 percent, and more preferably within 5 percent, within 3 percent, within 2 percent, within 1 percent, or within 0.5 percent. If there is no specific description, the values mentioned are to be regarded as an approximation that is an error or range expressed as "about", "approximate", or "substantially".

Although some embodiments are discussed with steps performed in a particular order, these steps may be performed in another logical order. Additional features can be provided to the semiconductor structures in embodiments of the present disclosure. Some of the features described below can be replaced or eliminated for different embodiments.

The present disclosure provides embodiments of a semiconductor structure which includes a source structure and a drain structure electrically connecting a seed layer on a substrate respectively by a pair of through-substrate vias which are disposed in the isolation region of the substrate. Because of the way that the pair of through-substrate vias are arranged, a voltage difference (i.e. a voltage difference between the source and the drain) can be generated inside the seed layer so that the electric field line extends to the layer (e.g. an insulating layer) disposed under the seed layer. A seed layer having a voltage difference inside does not shield the electric field line of the high electric field region in the semiconductor structure, thereby redistributing the electric field and increasing the breakdown voltage to allow the semiconductor device to be applied to high-voltage operation.

FIG. 1A is a cross-sectional view illustrating an exemplary semiconductor structure 100 according to some embodiments of the present disclosure. According to some embodiments, the semiconductor structure 100 includes a substrate 200 having an active region 201 and an isolation region 202, an insulating layer 210 disposed on the substrate 200, a seed layer 220 disposed on the insulating layer 210, a compound semiconductor layer 230 disposed on the seed layer 220, a gate structure 300 in the active region 210 disposed on the compound semiconductor layer 230, a source structure 400 and a drain structure 500 disposed on the substrate 200 and on opposite sides of the gate structure 300, and a pair of through-substrate vias 601, 602 passing through an isolation structure 240 in the isolation region 202.

In some embodiments, the substrate 200 may be a doped (such as doped with a p-type or an n-type dopant) or an undoped semiconductor substrate, such as a silicon substrate, a silicon germanium substrate, a gallium arsenide substrate, or the like. In other embodiments, the substrate 200 may be a ceramic substrate, such as an aluminium nitride (AlN) substrate, a silicon carbide (SiC) substrate, an aluminium oxide ($Al_2O_3$) (or so-called sapphire substrate), or the like. The ceramic substrate may be formed by powder metallurgy which sinters ceramic powders at high temperature.

The insulating layer 210 disposed on the substrate 200 is a layer having high thermal stability and high quality at a high temperature. In some embodiments, the insulating layer 210 is a high-quality silicon oxide insulating layer such as those produced from tetraethoxysilane (TEOS). In other embodiments, the insulating layer 210 is a dielectric layer, such as silicon oxide, silicon nitride, silicon oxynitride, silicon carbide, the like, or a combination thereof, formed by plasma-enhanced chemical vapor deposition (PECVD). In accordance with some embodiments of the present disclosure, the insulating layer 210 may provide a higher quality surface to facilitate subsequent formation of other layers of the semiconductor structure on its surface. In some embodiments, the thickness of the insulating layer 210 may be in a range from about 0.5 micrometers (um) to about 10 um, such as about 2 um.

In some embodiments, the material of the seed layer 220 formed on the insulating layer 210 may be silicon. In other embodiments, the seed layer 220 may be formed by other semiconductor materials, such as doped silicon carbide (e.g. the silicon carbide may be doped with nitrogen or phosphorus to form a n-type semiconductor or doped with aluminum, boron, gallium, or beryllium to form a p-type semiconductor), Group III-V compound semiconductor materials, or the like. In other embodiments, the seed layer 220 may include aluminum oxide ($Al_2O_3$). In some embodiments, the seed layer 220 may be conformally formed on the insulating layer 210 by an epitaxial growth process, such as metal organic chemical vapor deposition (MOCVD), hydride vapor phase epitaxy (HVPE), molecular beam epitaxy (MBE), a combination thereof, or the like.

In some embodiments, the compound semiconductor layer 230 formed on the seed layer 220 may include a buffer layer 231 disposed on the seed layer 220, a channel layer 232 disposed on the buffer layer 231, and a barrier layer 233 disposed on the channel layer 232.

The buffer layer 231 may be helpful to mitigate a strain of the channel layer 232 which is subsequently formed over the buffer layer 231, and to prevent defects formed in the overlying channel layer 232. The strain is caused by a mismatch between the channel layer 232 and the substrate 220. In some embodiments, the material of the buffer layer 231 may be AlN, GaN, $Al_xGa_{1-x}N$ (wherein 0<x<1), a combination thereof, or the like. The buffer layer 231 may be formed by an epitaxial growth process, such as metal organic chemical vapor deposition (MOCVD), hydride vapor phase epitaxy (HVPE), molecular beam epitaxy (MBE), a combination thereof, or the like. In some embodiments, the thickness of the buffer layer 231 thus formed is in a range from about 0.5 um to about 10 um, such as 3 um. It should be noted that although in the embodiment as shown in FIG. 1A the buffer layer 231 is a single layer structure, the buffer layer 231 may also be a multilayered structure (not shown).

According to some embodiments of the present disclosure, two-dimensional electron gas (2DEG) (not shown) is formed at a heterogeneous interface between the channel layer 232 and the barrier layer 233. The semiconductor structure 100 as shown in FIG. 1A is a high electron mobility transistor (HEMT) which utilizes 2DEG as conductive carriers. In some embodiments, the channel layer 232 may be a GaN layer, and the barrier layer 233 formed on the channel layer 232 may be an AlGaN layer, wherein the GaN layer and the AlGaN layer may be doped, such as with an n-type or a p-type dopant, or may have no dopant therein. The channel layer 23 and the barrier layer 233 may be formed by an epitaxial growth processes, such as MOCVD, HVPE, MBE, a combination thereof, or the like. In some embodiments, the thickness of the channel layer 232 thus formed may be in a range from about 300 nanometers (nm) to about 1 um, such as about 0.6 um. In some embodiments, the thickness of the barrier layer 233 thus formed may be in a range from about 5 nm to about 30 nm, such as about 25 nm.

Subsequently, according to some embodiments of the present disclosure, the isolation structure 240 may be formed in the compound semiconductor layer 230 of the substrate 200 to define the active region 201 and the isolation region 202. In some embodiments, as shown in FIG. 1A, the bottom surface of the isolation structure 240 may be in the buffer layer 231 included in the compound semiconductor layer 230. In other embodiments, the bottom surface of the isolation structure 240 may be level with the bottom surface of the buffer layer 231 and in contact with the seed layer 220 (not shown). In some embodiments, by the formation of the isolation structure 240, the two-dimensional electron gas (2DEG) which is formed at a heterogeneous interface between the channel layer 232 and the buffer layer 233 may be isolated in the active region 201.

According to some embodiments of the present disclosure, the isolation structure 204 may be formed by breaking the crystal lattice structure of the compound semiconductor layer 230 at a predetermined position of the isolation structure 240, so that the portion of the compound semiconductor layer 230 loses piezoelectricity and becomes non-conductive. In such embodiments, nitrogen (N), oxygen (O), or other suitable elements may be implanted into the compound semiconductor layer 230 (e.g. a gallium nitride layer) by an ion implantation process to break the lattice structure to convert the compound semiconductor layer 230 at a predetermined position into the isolation structure 240. In other embodiments, the materials of the isolation structure 240 may be dielectric materials, such as silicon oxide, silicon nitride, silicon oxynitride, aluminum oxide, the like, or a combination thereof, and may be formed as a trench isolation structure in the compound semiconductor layer 230 by an etching process and a deposition process.

Subsequently, gate structure 300 is formed on the compound semiconductor layer 230 (e.g. the barrier layer 233) in the active region 201, the source structure 400 and the drain structure 500 are formed on opposite sides of the gate structure 300, and an interlayer dielectric layer (e.g. the first dielectric layer 250, the second dielectric layer 260, and the third dielectric layer 270) is formed on the compound semiconductor layer 230 to form the semiconductor structure 100. According to some embodiments, the semiconductor structure 100 is a high electron mobility transistor (HEMT). In some embodiments, the gate structure 300 includes a gate electrode 301 and a gate metal layer 302, wherein the gate electrode 301 is disposed on the barrier layer 233 and the gate metal layer 302 is disposed on and electrically connects the gate electrode 301. In other embodiments, an optional doped compound semiconductor layer 234 may be disposed between the gate electrode 301 and the barrier layer 233. The details will be further described later. The source structure 400 includes a source electrode 401, a source contact 402, and a source metal layer 403 which are electrically connected with each other, and the drain structure 500 includes a drain electrode 501, a drain contact 502, and a drain metal layer 503 which are electrically connected with each other. In some embodiments, the source structure 400 and the drain structure 500 disposed on opposite sides of the gate structure 300 are in the active region 201 and pass through the barrier layer 233 to contact the channel layer 232.

In some embodiments, the material of the gate electrode 301 may be conductive materials, such as metal, metal nitride, or semiconductor materials. In some embodiments, the metal materials may be Au, Ni, Pt, Pd, Ir, Ti, Cr, W, Al, Cu, the like, a combination thereof, or multilayers thereof. The semiconductor materials may be polycrystalline silicon or polycrystalline germanium. The conductive material may be formed on the barrier layer 233 by chemical vapor deposition (CVD), sputtering, resistive thermal evaporation process, electron beam evaporation process, or other suitable deposition processes, and a patterning process is performed on the conductive material to form the gate electrode 301.

According to some embodiments of the present disclosure, before the formation of the gate electrode 301, the doped compound semiconductor layer 234 may be formed on the barrier layer 233, and the gate electrode 301 is formed on the doped compound semiconductor layer 234 subsequently. The generation of 2DEG under the gate electrode 301 can be inhibited by the doped compound semiconductor layer 234 disposed between the gate electrode 301 and the barrier layer 233 so as to attain a normally-off status of the semiconductor structure 100. In some embodiments, the material of the doped compound semiconductor layer 234 may be GaN which is doped with a p-type dopant or an n-type dopant. The steps of forming the doped compound semiconductor layer 234 may include depositing a doped compound semiconductor layer (not shown) on the barrier layer 233 by using an epitaxial growth process, and performing a patterning process on the doped compound semiconductor layer to form the doped compound semiconductor layer 234 corresponding to the predetermined position where the gate electrode 301 is to be formed. In some embodiments, the thickness of the doped compound semiconductor layer 234 thus formed is in a range from about 50 nm to about 100 nm.

The material of the source electrode 401 and the drain electrode 501 which are formed on opposite sides of the gate electrode 301 in the active region 201 may be substantially the same as the material of the gate electrode 121. The details are not described again herein to avoid repetition. In some embodiments, as shown in FIG. 1A, the source electrode 401 and drain electrode 501 both pass through the barrier layer 233 and contact the channel layer 231.

In some embodiments, the gate metal layer 302, the source contact 402, the source metal layer 403, the drain contact 502, and the drain metal layer 503 may be formed by a deposition process and a patterning process. The material of gate metal layer 302, the source contact 402, the source metal layer 403, the drain contact 502, and the drain metal layer 503 may include conductive materials, such as aluminium (Al), copper (Cu), tungsten (W), titanium (Ti), tantalum (Ta), titanium nitride (TiN), tantalum nitride (TaN), nickel silicide (NiSi), cobalt silicide (CoSi), tantalum carbide (TaC), tantulum silicide nitride (TaSiN), tantalum carbide nitride (TaCN), titanium aluminide (TiAl), titanium aluminide nitride (TiAlN), metal oxides, metal alloys, other suitable conductive materials, or a combination thereof.

According to some embodiments of the present disclosure, as shown in FIG. 1A, the gate electrode 301 is embedded in the first dielectric layer 250, and the gate metal layer 302 is embedded in the first dielectric layer 250 and the second dielectric layer 260 which is formed on the first dielectric layer 250. Furthermore, the source contact 402 and the drain contact 502 on opposite sides of the gate structure 300 both pass through the first dielectric layer 250 and the second dielectric layer 260 on the compound semiconductor layer 230 and respectively contact source electrode 401 and the drain electrode 501. The source metal layer 403 and the drain metal layer 503 are formed on the second dielectric layer 260 and are respectively electrically connected to the source contact 402 and drain contact 502.

In some embodiments, the first dielectric layer 250 and the second dielectric layer 260 may include single layer or multi-layers of dielectric materials, such as silicon oxide, silicon nitride, silicon oxynitride, tetraethoxysilane (TEOS), phosphosilicate glass (PSG), borophosphosilicate glass (BPSG), low-k dielectric materials, and/or other suitable dielectric materials. The low-k dielectric materials may include fluorinated silica glass (FSG), hydrogen silsesquioxane (HSQ), carbon-doped silicon oxide, amorphous fluorinated carbon, parylene, bis-benzocyclobutenes (BCB), or polyimide, but not limited thereto. For example, a deposition process, such as spin coating, chemical vapor deposition (CVD), physical vapor deposition (PVD), atomic layer deposition (ALD), high density plasma CVD (HDPCVD), other suitable methods, or a combination thereof, may be used to deposit the dielectric materials on the compound semiconductor layer 230 (e.g. the barrier layer 233) and the isolation structure 240 to form the first dielectric layer 250 and the second dielectric layer 260.

According to some embodiments of the present disclosure, the pair of through-substrate vias 601, 602 included in the semiconductor structure 100 shown in FIG. 1A are disposed in the isolation region 202 and on opposite sides of the gate structure 300. In some embodiments, the pair of through-substrate vias may be through-GaN vias (TGV). The through-substrate vias 601, 602 pass through the second dielectric layer 260, the first dielectric layer 250, the isolation structure 240, and the buffer layer 231 in the isolation region 202 to contact the seed layer 220. In the embodiments that the bottom surface of the isolation structure 240 is in direct contact with the seed layer 220, the through-substrate vias 601, 602 passing through the isolation structure 240 may directly contact the seed layer 220 without through the buffer layer 231 (not shown). By having the through-substrate vias 601, 602 disposed in the isolation region 202, the through-substrate vias 601, 602 may be prevented from coming into contact with the 2DEG formed in the heterogeneous interface between the channel layer 232 and the barrier layer 233 which may cause electrical abnormality.

Referring to FIG. 1A, the source structure 400 and the drain structure 500 are respectively electrically connected to the seed layer 220 by the through-substrate vias 601, 602. Specifically, the source structure 400 contacts the through-substrate via 601 through the source metal layer 403 which is across the active region 201 and the isolation region 202 to electrically connect to the seed layer 220. The drain structure 500 contacts the through-substrate via 602 through the drain metal layer 503 which is across the active region 201 and the isolation region 202 to electrically connect to the seed layer 220. According to some embodiments of the present disclosure, the voltage difference inside the seed layer 220 which respectively electrically connects the source structure 400 and the drain structure 500 is substantially the same as the voltage difference between the source electrode 401 and the drain electrode 501.

According to some embodiments of the present disclosure, the formation of the through-substrate vias 601, 602 includes performing a lithography and an etching process to the compound semiconductor layer 230, the isolation structure 240, the first dielectric layer 250, and the second dielectric layer 260 in the isolation region 202 to form a pair of holes (not shown) on opposite sides of the gate structure 300. Subsequently, the pair of holes are filled with conductive materials to form the through-substrate vias 601, 602. In some embodiments, the conductive materials may be selected from the materials for forming the gate metal layer 302, the source contact 402, the source metal layer 403, the drain contact 502, and the drain metal layer 503. The details are not described again herein to avoid repetition. According to some embodiments of the present disclosure, the aperture size of each of the through-substrate vias 601, 602 is in a range from 0.5 um to 5 um. By arranging the pair of through-substrate vias 601, 602 this way, a voltage difference (i.e. a voltage difference between the source and the drain) can be generated inside the seed layer so that the electric field line extends to the layer (e.g. an insulating layer) disposed under the seed layer, thereby redistributing the electric field and increasing the breakdown voltage. Furthermore, the above-mentioned arrangement of the through-substrate vias 601, 602 may be applied to a semiconductor device using a ceramic substrate such that the performance of the semiconductor device under high-voltage operation can be significantly enhanced.

Figure 1B:
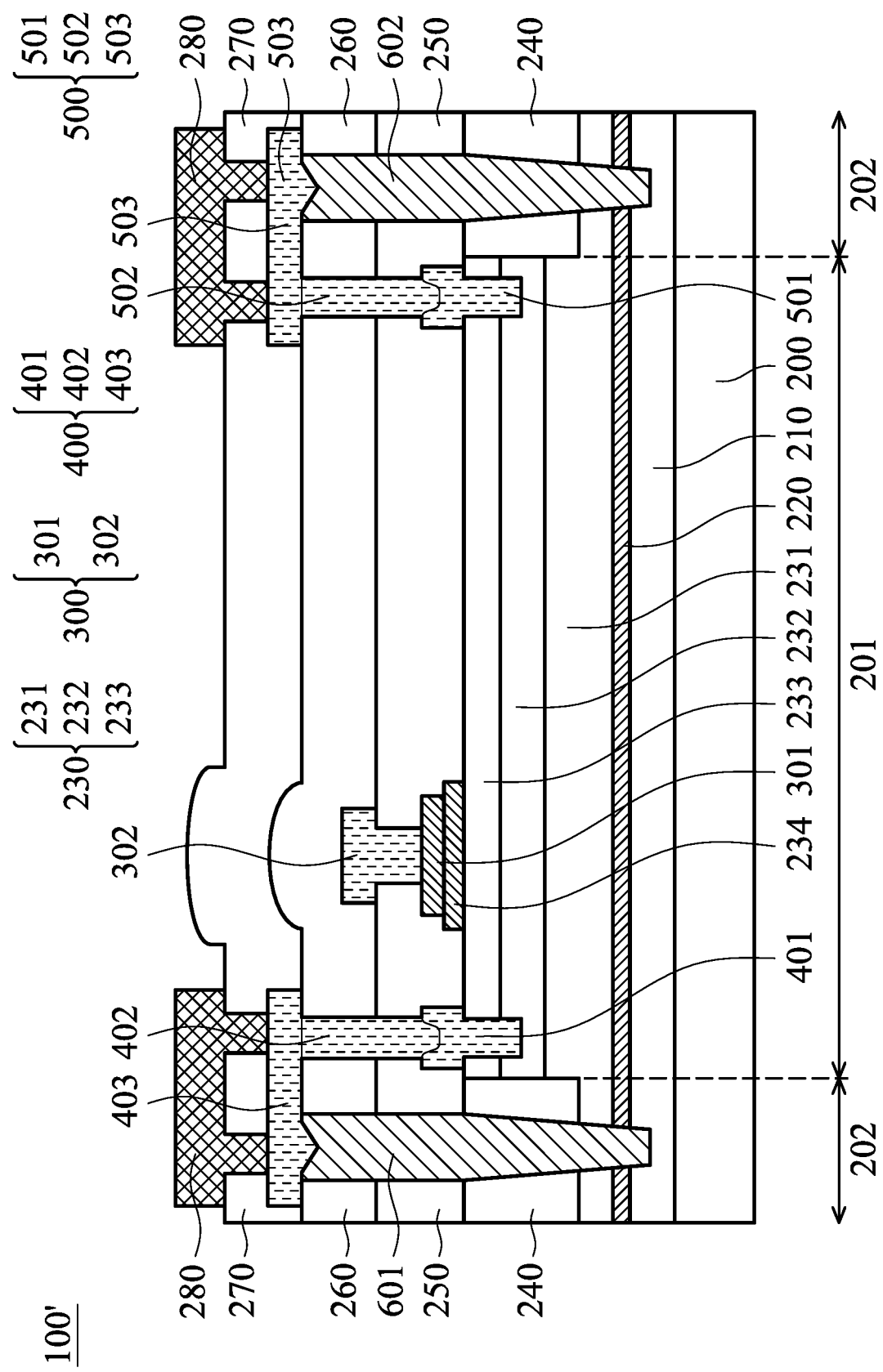
FIG. 1B is a cross-sectional diagram illustrating an exemplary semiconductor according to other embodiments of the present disclosure.

Referring to FIG. 1A along with FIG. 1B, the semiconductor structure 100' illustrated in FIG. 1B is substantially the same as the semiconductor structure 100 illustrated in FIG. 1A, and the difference is that the through-substrate vias 601, 602 included in the semiconductor structure 100' further pass through the seed layer 220 and contact the insulating layer 210. In some embodiments, the bottom surface of the through-substrate vias 601, 602 may be in the insulating layer 210, as shown in FIG. 1B. In other embodiments, the bottom surface of the through-substrate vias 601, 602 may contact the top surface of the insulating layer 210 (not shown).

In summary, by the above-mentioned arrangement of the pair of through-substrate vias 601, 602, a voltage difference (i.e. a voltage difference between the source electrode 401 and the drain electrode 501) can be generated inside the seed layer 220 such that the electric field line extends to the insulating layer 210 disposed under the seed layer 220. The seed layer 220 having a voltage difference inside does not shield the electric field line of the high electric field region (e.g. the compound semiconductor layer 230 under the gate structure 300 in the active region 201) in the semiconductor structures 100, 100', thereby redistributing the electric field. As a result, the insulating layer 210 in the semiconductor structures 100, 100' can withstand the applied voltage together with the compound semiconductor layer 230 formed on the insulating layer 210, thereby increasing the breakdown voltage to allow the semiconductor device 100, 100' to be applied to high-voltage operation.

It should be noted that although only a pair of through-substrate vias 601, 602 are illustrated herein, and the embodiments of the present disclosure may also include multiple pairs of through-substrate vias through which the source structure 400 is electrically connected to the seed layer 220, and through which, respectively and at the same time (not shown), the drain structure 500 is electrically connected to the seed layer 220. In other embodiments, the number of through-substrate vias which electrically connects the source structure 400 and the seed layer 220 may be different from the number of through-substrate vias which electrically connects the drain structure 500 and the seed layer 220 (not shown).

According to some embodiments of the present disclosure, the semiconductor structure 100 illustrated in FIG. 1A may include a third dielectric layer 270 formed on the second dielectric layer 260 and covering the source metal layer 403 and the drain metal layer 503, and a metal layer 280 passing through the third dielectric layer 270 and respectively electrically connecting the source metal layer 403 and the drain metal layer 503. In some embodiments, the materials of the third dielectric layer 270 may be selected from the above-mentioned materials for forming the first dielectric layer 250 and the second dielectric layer 260. The materials and the formation methods of the metal layer 280 are substantially the same as those of the source metal layer 403 and the drain metal layer 502. The details are not described again herein to avoid repetition. It should be noted that although the embodiment of the present disclosure merely illustrates single third dielectric layer 270 and single metal layer 280, the embodiments of the present disclosure are not limited thereto. The number of third dielectric layers 270 and metal layers 280 may be adjusted, depending on the design of the product.

Figure 2A:
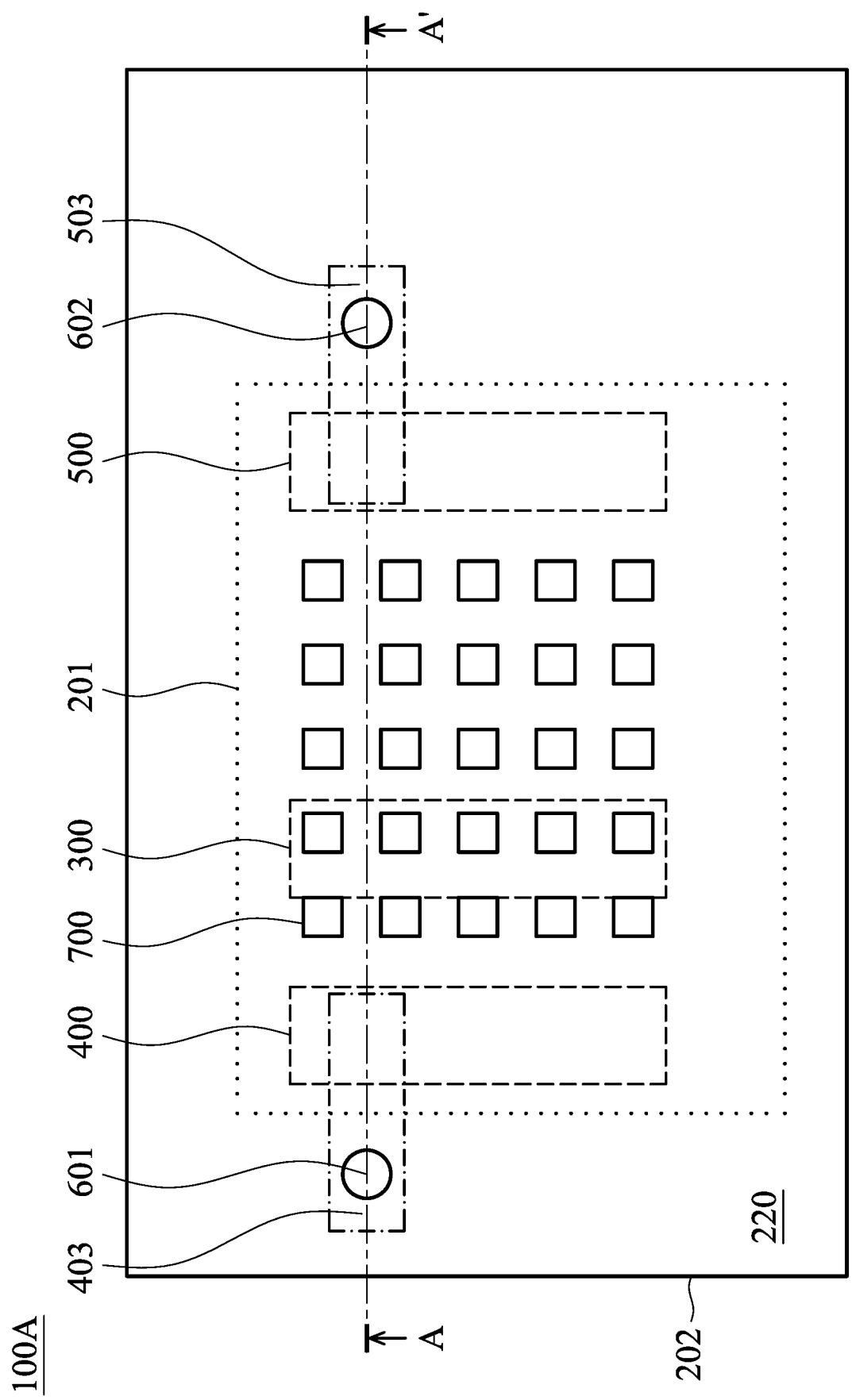
FIG. 2A is a top-view diagram illustrating a portion of an exemplary semiconductor structure according to some embodiments of the present disclosure.
Figure 2B:
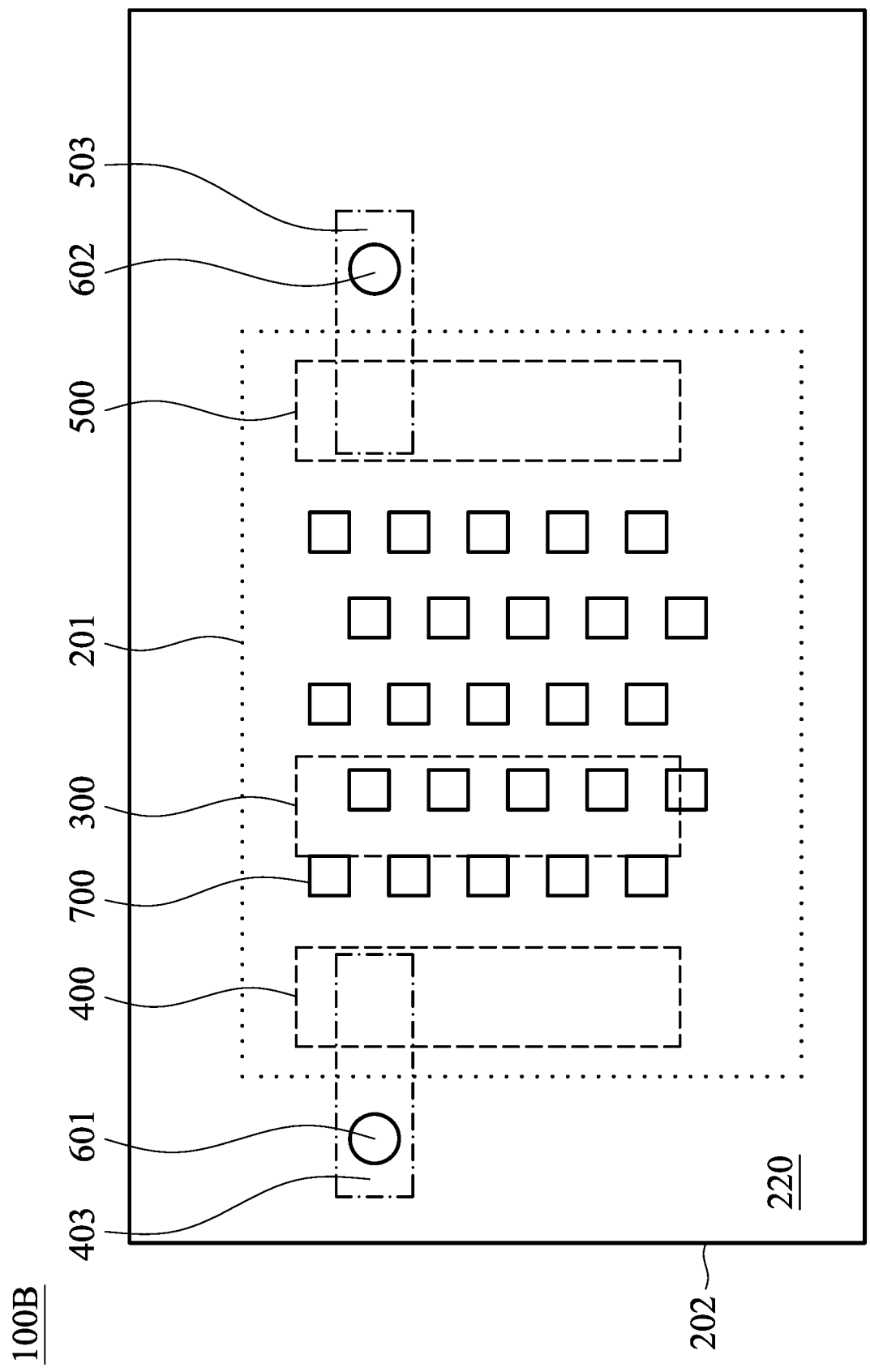
FIG. 2B is a top-view diagram illustrating a portion of an exemplary semiconductor structure according to other embodiments of the present disclosure.
Figure 2C:
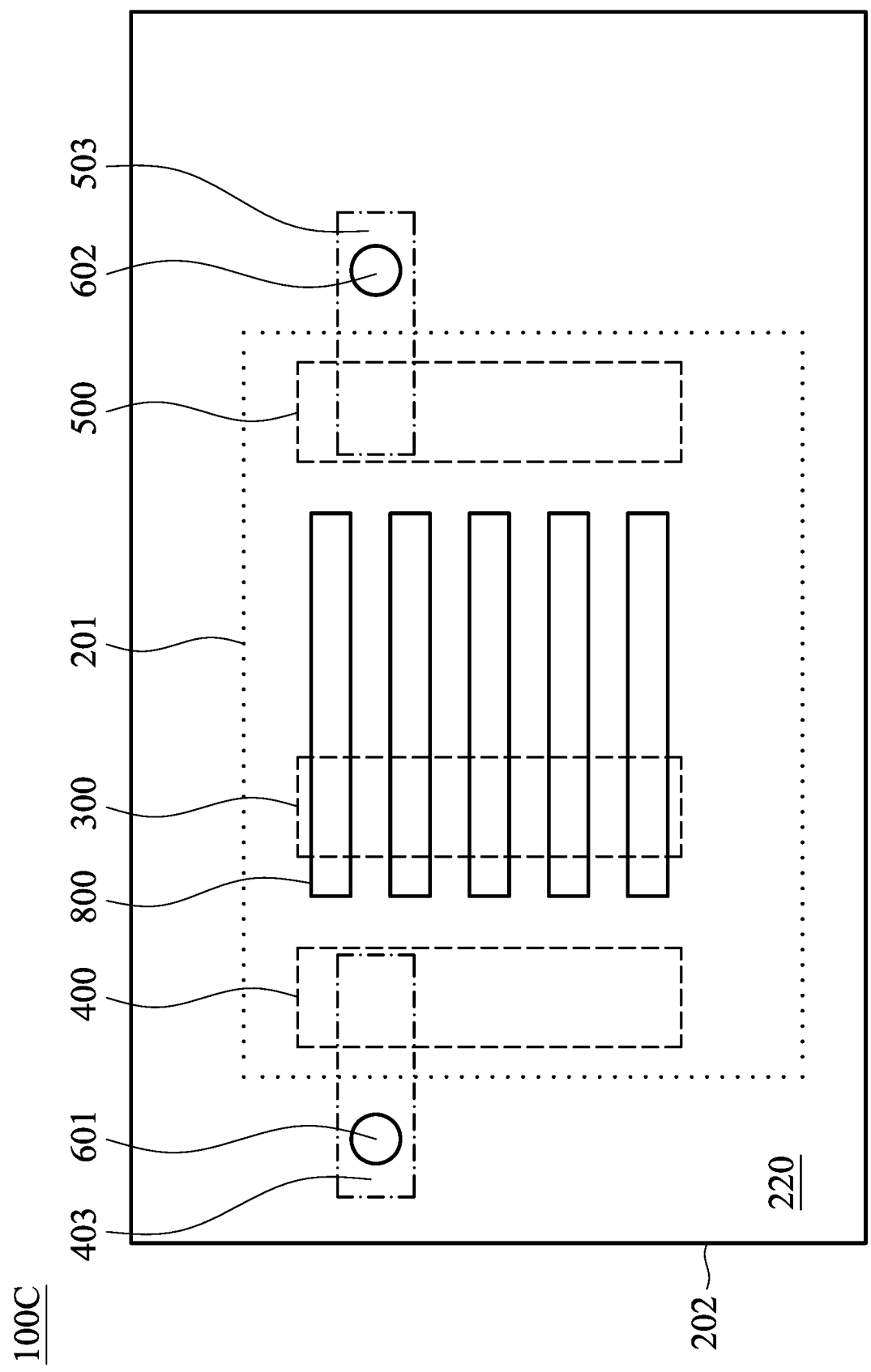
FIG. 2C is a top-view diagram illustrating a portion of an exemplary semiconductor structure according to another embodiment of the present disclosure.

According to some embodiments of the present disclosure, the semiconductor structure 100 illustrated in FIG. 1A may have various arrangements from a top view, such as the semiconductor structures 100A, 100B, and 100C respectively illustrated in FIGS. 2A, 2B, and 2C. For example, the semiconductor structure 100 illustrated in FIG. 1A may correspond to the cross-section A-A' illustrated in FIG. 2A, wherein the cross-section A-A' does not pass through an opening 700 of the seed layer 220. In other embodiments, the seed layer 220 of the semiconductor structure 100 illustrated in FIG. 1A may not have an opening (not shown).

FIG. 2A is a top-view diagram illustrating a portion of an exemplary semiconductor structure 100A according to some embodiments of the present disclosure. It should be noted that in order to succinctly describe the embodiments of the present disclosure and highlight the technical features thereof, not all the elements of the semiconductor structure 100A are illustrated in FIG. 2A. Referring to FIG. 2A, the semiconductor structure 100A includes the active region 201, the isolation region 2020 surrounding the active region 201, the gate structure 300, the source structure 400, and the drain structure 500 formed in the active region 201, the through-substrate vias 601, 602 formed in the isolation region 202, and the seed layer 220 having a plurality of openings 700 in the active region 201. In some embodiments, the openings 700 of the seed layer 220 may expose the insulating layer 210 under the seed layer 220. According to some embodiments, from a top view, the openings 700 in the active region 201 may be arranged into an array, as shown in FIG. 2A. For example, the array may include five columns and five rows of aligned openings 700.

FIG. 2B is a top-view diagram illustrating a portion of an exemplary semiconductor structure 100B according to other embodiments of the present disclosure. The semiconductor structure 100B illustrated in FIG. 2B is substantially the same as the semiconductor structure 100A illustrated in FIG. 2A. The details are not described again herein to avoid repetition. The difference between the semiconductor structure 100B and the semiconductor structure 100A is that the plurality of openings 700 of the seed layer 220 in the active region 201 of the semiconductor structure 100B are in a staggered order.

FIG. 2C is a top-view diagram illustrating a portion of an exemplary semiconductor structure 100C according to another embodiment of the present disclosure. The semiconductor structure 100C illustrated in FIG. 2C is substantially the same as the semiconductor structures 100A, 100B respectively illustrated in FIGS. 2A, 2B. The details are not described again herein to avoid repetition. The difference between the semiconductor structure 100C and the semiconductor structures 100A, 100B is that the seed layer 220 in the active region 201 of the semiconductor structure 100C has the plurality of strip-shaped openings 800. As shown in FIG. 2C, the major axis of the plurality of the strip-shaped openings 800 is parallel to the direction from the through-substrate via 601 to the through-substrate via 602, and the plurality of strip-shaped openings 800 are arranged along the minor axis of which in the active region 201.

According to some embodiments of the present disclosure, the plurality of the openings of the seed layer 220 in the active region 201 may form a high resistance region to reduce the leakage current between the drain structure and the source structure. It should be noted that the shape, number, size, and arrangement of the openings of the seed layer 220 illustrated in FIGS. 2A, 2B, and 2C are merely exemplary. The arrangement of openings of the seed layer 220 may be adjusted, depending on the design of the product, so the embodiments of the present disclosure are not limited thereto.

The semiconductor structure provided by the embodiments of the present disclosure can electrically connect both the source structure and the drain structure to the seed layer by using a pair of through-substrate vias, so that a voltage difference can be generated inside the seed layer to make the electric field line extend to the layer (e.g. an insulating layer) disposed under the seed layer. According to the embodiments of the present disclosure, a seed layer having a voltage difference therein does not shield the electric field line of a high electric field region (e.g. the compound semiconductor layer disposed under the gate) in the semiconductor structure, thereby redistributing the electric field. In this way, the insulating layer in the semiconductor structure can withstand the applied voltage together with the compound semiconductor layer formed on the insulating layer, thereby increasing the breakdown voltage and improving the performance of the semiconductor structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate having an active region and an isolation region;
   an insulating layer disposed on the substrate;
   a seed layer disposed on the insulating layer;
   a compound semiconductor layer disposed on the seed layer;
   a gate structure disposed on the compound semiconductor layer in the active region;
   an isolation structure disposed on the substrate in the isolation region;
   a pair of through-substrate vias in the isolation region disposed on opposite sides of the gate structure, wherein the pair of through-substrate vias pass through the isolation structure and contact the seed layer; and
   a source structure and a drain structure disposed on the substrate and on opposite sides of the gate structure, wherein the source structure and the drain structure are respectively electrically connected to the seed layer by the pair of through-substrate vias.

2. The semiconductor structure as claimed in claim 1, wherein the compound semiconductor layer comprises:
   a buffer layer disposed on the seed layer;
   a channel layer disposed on the buffer layer in the active region; and a barrier layer disposed on the channel layer in the active region.

3. The semiconductor structure as claimed in claim 2, wherein a thickness of the insulating layer is in a range from 0.5 um to 10 um, a thickness of the buffer layer is in a range from 0.5 um to 10 um, a thickness of the channel layer is in a range from 300 nm to 1 um, and a thickness of the barrier layer is in a range from 5 nm to 30 nm.

4. The semiconductor structure as claimed in claim 2, further comprising a dielectric layer disposed on the compound semiconductor layer.

5. The semiconductor structure as claimed in claim 2, wherein the gate structure comprises:
a gate electrode layer disposed on the barrier layer; and
a gate metal layer disposed on the gate electrode layer and electrically connected to the gate electrode layer.

6. The semiconductor structure as claimed in claim 5, further comprising a doped compound semiconductor layer disposed between the gate electrode layer and the barrier layer.

7. The semiconductor structure as claimed in claim 1, wherein the pair of through-substrate vias further pass through the seed layer and contact the insulating layer.

8. The semiconductor structure as claimed in claim 4, wherein the source structure comprises:
a source electrode in the active region passing through the barrier layer and contacting the channel layer;
a source contact in the active region passing through the dielectric layer and contacting the source electrode; and
a source metal layer disposed on the dielectric layer and electrically connecting the source contact to one of the pair of through-substrate vias.

9. The semiconductor structure as claimed in claim 8, wherein the drain structure comprises:
a drain electrode in the active region passing through the barrier layer and contacting the channel layer;
a drain contact in the active region passing through the dielectric layer and contacting the drain electrode; and
a drain metal layer disposed on the dielectric layer and electrically connecting the drain contact to another one of the pair of through-substrate vias.

10. The semiconductor structure as claimed in claim 1, wherein the seed layer comprises silicon, silicon carbide, or aluminum oxide.

11. The semiconductor structure as claimed in claim 1, wherein aperture size of the pair of through-substrate vias is in a range from 0.5 um to 5 um.

12. The semiconductor structure as claimed in claim 1, wherein from a top view, the seed layer comprises a plurality of openings in the active region.

13. The semiconductor structure as claimed in claim 12, wherein from a top view, the plurality of openings are arranged in an array.

14. The semiconductor structure as claimed in claim 12, wherein from a top view, the plurality of openings are arranged in a staggered manner.

15. A semiconductor structure, comprising:
a ceramic substrate having an active region and an isolation region;
an insulating layer disposed on the ceramic substrate;
a seed layer disposed on the insulating layer, wherein the insulating layer is between the ceramic substrate and the seed layer;
a compound semiconductor layer disposed on the seed layer;
a gate structure disposed on the compound semiconductor layer in the active region; and
a source structure and a drain structure disposed on the ceramic substrate and on opposite sides of the gate structure, wherein the source structure and the drain structure are respectively electrically connected to the seed layer.

16. The semiconductor structure as claimed in claim 15, further comprising:
an isolation structure disposed on the substrate in the isolation region; and
a pair of through-substrate vias in the isolation region disposed on opposite sides of the gate structure, wherein the pair of through-substrate vias pass through the isolation structure and contact the seed layer, and the source structure and the drain structure are respectively electrically connected to the seed layer by the pair of through-substrate vias.

17. The semiconductor structure as claimed in claim 16, wherein the pair of through-substrate vias further pass through the seed layer and contact the insulating layer.

18. The semiconductor structure as claimed in claim 15, wherein the compound semiconductor layer comprises:
a buffer layer disposed on the seed layer;
a channel layer disposed on the buffer layer in the active region; and
a barrier layer disposed on the channel layer in the active region.

19. The semiconductor structure as claimed in claim 15, wherein the ceramic substrate is an aluminum nitride substrate, a silicon carbide substrate, or an aluminum oxide substrate.

20. The semiconductor structure as claimed in claim 15, wherein from a top view, the seed layer comprises a plurality of strip-shaped openings in the active region.

* * * * *